United States Patent [19]

Tipon

[11] 3,895,312

[45] July 15, 1975

[54] LOW NOISE HIGH SPECTRAL PURITY MICROWAVE FREQUENCY SYNTHESIZER

[75] Inventor: Paul G. Tipon, San Ramon, Calif.

[73] Assignee: Systron Donner Corporation, Concord, Calif.

[22] Filed: Aug. 6, 1973

[21] Appl. No.: 385,989

[52] U.S. Cl. .................................. 331/18; 331/25

[51] Int. Cl. .................................. H03b 3/04

[58] Field of Search ............ 331/5, 6, 18, 25, 30, 19

[56] References Cited

UNITED STATES PATENTS

| | | | |
|---|---|---|---|
| 3,023,370 | 2/1962 | Waller | 331/25 X |
| 3,427,561 | 2/1969 | Hamer | 331/30 X |
| 3,706,039 | 12/1972 | Bott | 331/18 X |

*Primary Examiner*—Siegfried H. Grimm
*Attorney, Agent, or Firm*—Flehr, Hohbach, Test, Albritton & Herbert

[57] ABSTRACT

A microwave frequency synthesizer includes a phase locked loop with dual reference sources. One source is coupled into the loop by a mixer and provides multiples of 100 MHz at a frequency range of, for example, 2 to 4 gigahertz which is provided by a crystal controlled oscillator and provides a final multiplied output frequency offset by 100 MHz to 200 MHz from the final desired output frequency. A second low frequency variable frequency synthesizer is coupled into the phase locked loop by a phase detector the other input of the phase detector being coupled from the mixer by a relatively low division unit of, for example, 10. Thus, the low frequency reference noise is not multiplied up excessively to, therefore, provide for a relatively low noise, high spectral purity output.

4 Claims, 4 Drawing Figures

LOW NOISE HIGH SPECTRAL PURITY MICROWAVE FREQUENCY SYNTHESIZER

BACKGROUND OF THE INVENTION

The present invention is directed to a low noise high spectral purity microwave frequency synthesizer.

The rapid expansion of the use of frequencies in the microwave region has created the need for highly sophisticated means of generating the required signals. Transmission through deep space requires signals with exceptional spectral purity. Satellite communication systems require very precise yet easily changed frequencies. Development laboratories and research facilities need high purity, stable frequency sources as well as sources with wide band sweep and modulation capabilities.

Present signal source systems available to perform these functions are generally large and very expensive. In addition, they are not capable of meeting low noise and spurious signal specification requirements. Such systems generally utilize a low frequency synthesizer whose signal is multiplied to the desired microwave frequency. This inherently degrades the performance especially from a noise standpoint since the noise that is associated with the low frequency source is also multiplied up at the rate of 20 log N, where N is the multiplication ratio.

OBJECTS AND SUMMARY OF THE INVENTION

It is, therefore, an object of the present invention to provide an improved microwave frequency synthesizer which has superior noise and spurious output characteristics.

In accordance with the above object there is provided a low noise, high spectral purity microwave frequency synthesizer which includes a tunable microwave oscillator. A phase locked loop (PLL) includes the oscillator and a series coupled mixer and phase detector respectively coupled to and responsive to first and second reference sources. The first reference source provides an output frequency of the same order of magnitude of the output of the frequency synthesizer and is of the crystal controlled type where the output frequency is variable in discrete steps. The second reference source is continuously variable over a frequency range equivalent to the range of the step and at least an order of magnitude below the output frequency of the first reference source.

DETAILED DESCRIPTION OF THE PREFERRED EMBODIMENT

Figure 1:
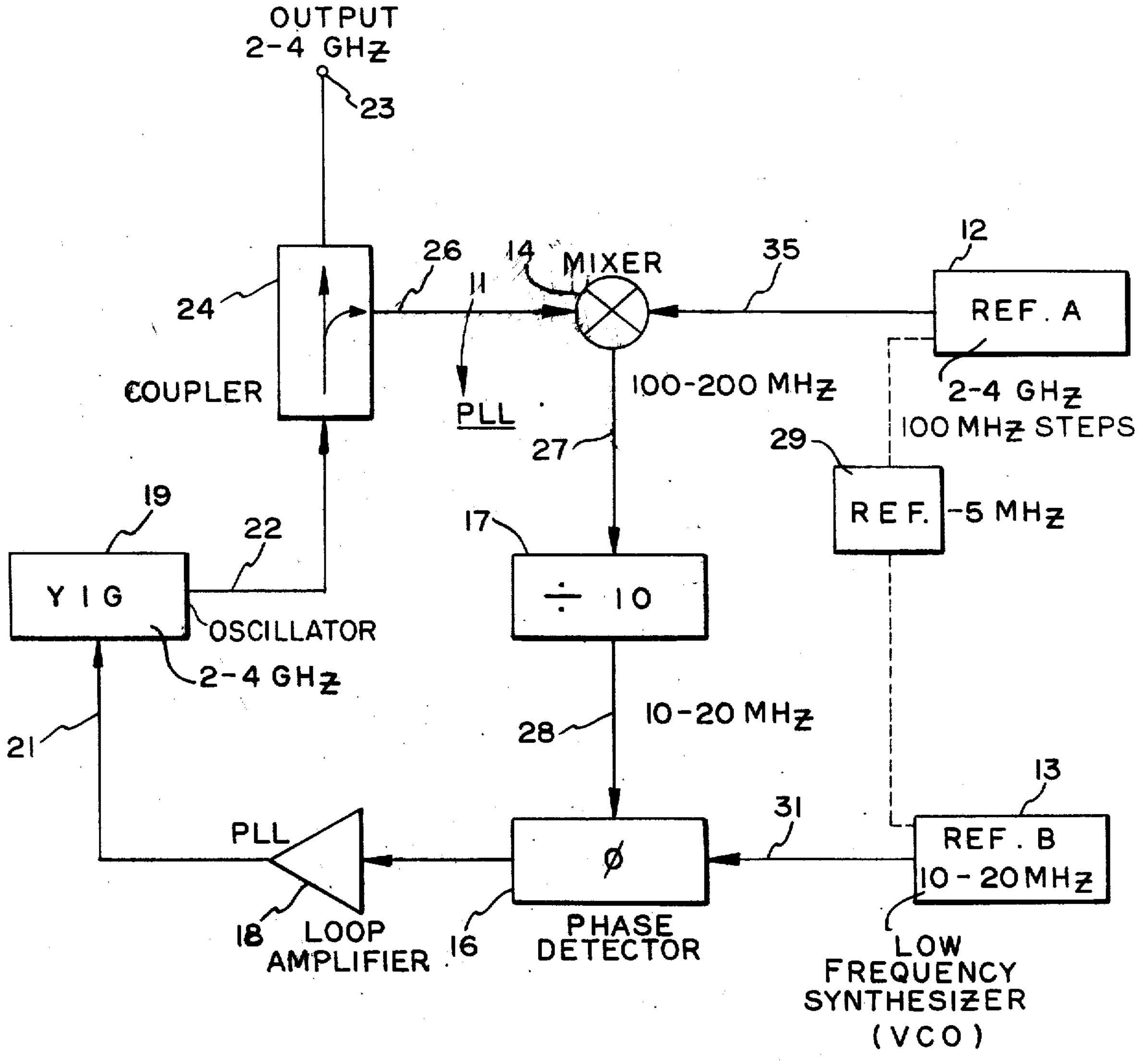
FIG. 1 is a block diagram embodying the present invention.

FIG. 1 illustrates a simplified block diagram of the circuit of the present invention which conceptually includes three different stages; namely, a phase locked loop (PLL) 11, a first frequency source 12 denoted reference A and a second frequency source 13 denoted reference B. The phase locked loop 11 includes a series coupled mixer 14 and phase detector 16. Reference A is coupled to mixer 14 and reference B to phase detector 16. Typical frequencies of operation are given on the drawing.

Divide by 10 unit 17 divides down the difference frequency of mixer 14 by 10 and applies it to phase detector 16 which compares the phase of the frequency output of reference B and applies it to loop amplifier 18 of the phase locked loop. This error signal of the loop is applied to a yttrium iron-garnet tunable microwave oscillator 19 known in the art as a YIG unit on line 21. The output of oscillator 19 on line 22 is a microwave frequency in the range of from 2 to 4 gigahertz which is coupled to an output terminal 23 through microwave coupler 24. The coupler on line 26 also provides the other input to mixer 14 which is compared in frequency to the frequency output of reference A on line 35 to provide a difference frequency, which in the preferred embodiment is 100–200 MHz, on the mixer output line 27. This is divided by 10 down to 10 to 20 MHz which matches in frequency the output of reference source B.

Reference source B creates a low noise narrow band VHF signal with a high degree of frequency resolution; in fact, a resolution of up to 1 Hz. Thus, it is in effect a continuously variable frequency source. As indicated it may be supplied a reference frequency from, for example, a 5 MHz source indicated at 29 which may also supply reference A in order to promote phase congruence of the two references A and B. Reference B may be of many different types but would normally include multiple phase locked loops with means for varying the frequency over the desired range. Thus, its output on line 31 because of its variable nature has relatively high noise. However, in accordance with the invention, this noise is not multiplied up, for example, one hundred times to the two gigahertz output but rather is effectively multiplied at a maximum 10 by reason of the divide by 10 unit 17. This thus minimizes the noise contributed to the microwave synthesizer by reference source B. Thus, reference source B has an equivalent output frequency from a noise standpoint of 100–200 MHz which frequency is, of course, equal to the output difference frequency of mixer 14 on line 27.

Such difference frequency is provided by reference source A in that its frequency is variable in 100 MHz steps to provide an offset of that step from the final output frequency at terminal 23. However, the reference source A produces a relatively low noise signal in the microwave frequency range by phase locked multiplication using a crystal oscillator source. Reference source A may be of many different types as indicated in FIGS. 2, 3 and 4.

Figure 2:
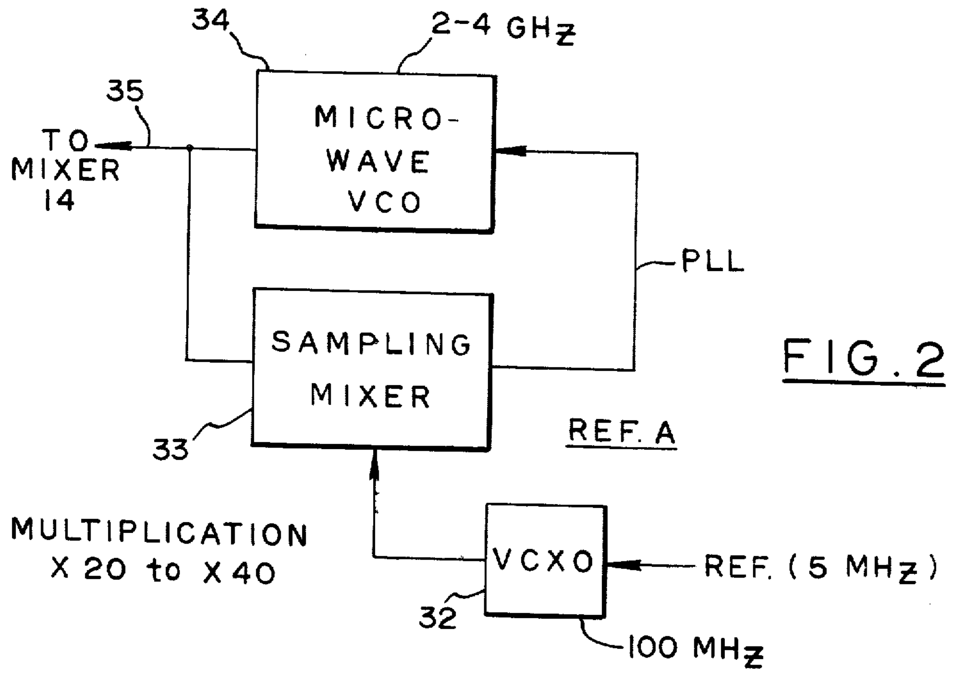
FIG. 2 is a more detailed block diagram of a portion of FIG. 1.

In FIG. 2 a crystal controlled VCO 32 is coupled to the 5 MHz reference 29 and generates a signal of 100 MHz. This is coupld to a sampling mixer 33 which is part of a phase locked loop which includes a microwave voltage controlled oscillator 34 which has an output on line 35 coupled to mixer 14. Thus, the 100 MHz of the crystal controlled oscillator is multiplied twenty to forty times by phase locked multiplication techniques.

Figure 3:
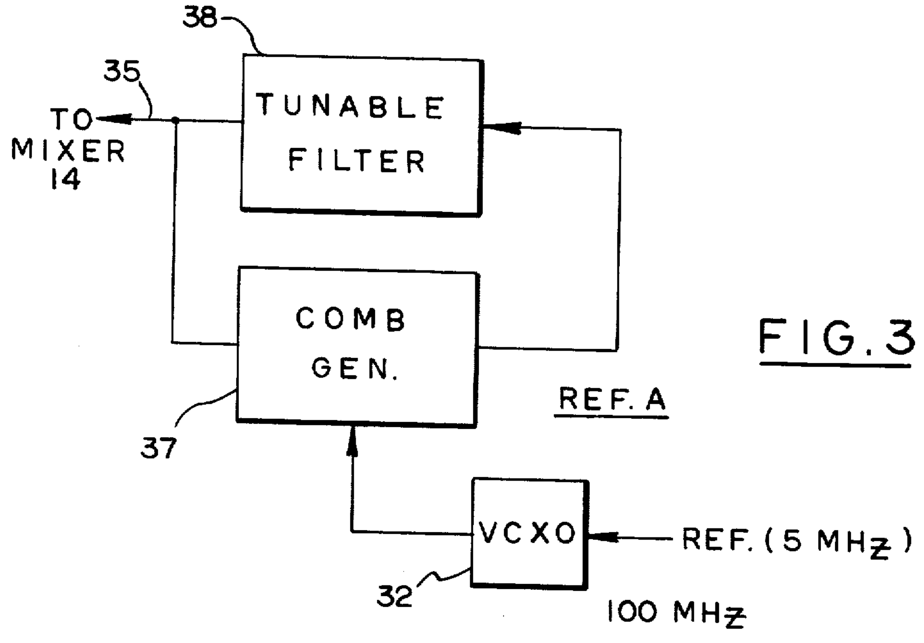
FIG. 3 is an alternative embodiment of FIG. 2.

FIG. 3 shows a somewhat similar embodiment to FIG. 2 where a similar VCO 32 is used but which instead drives a comb generator 37 to provide the 100 MHz steps or multiplication. This again forms a phase locked loop which includes a tunable filter 38 whose output is on line 35 to the mixer.

Figure 4:
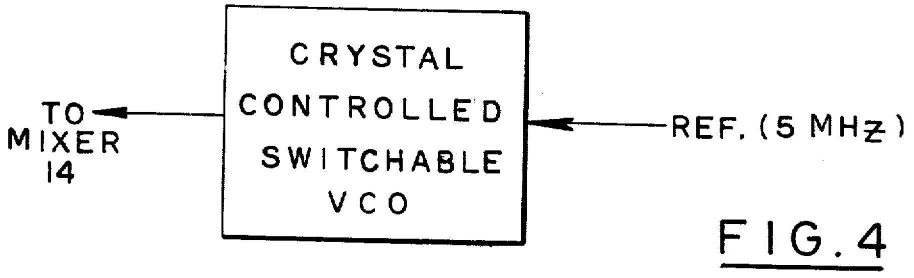
FIG. 4 is an alternative embodiment of FIGS. 2 and 3.

Lastly, the embodiment of FIG. 4 is merely a crystal controlled switchable voltage controlled oscillator which is controllable in 100 MHz steps.

In summary with regard to the purity of the output frequency of reference A the crystal controlled oscillator used in this manner is believed to provide the lowest noise characteristic at microwave frequencies. When this is combined in the dual reference phase locked loop 11 with the relatively unmultiplied, or low multiplication of, for example 10 or less, of the reference source B the overall noise purity of the synthesizer of the present invention is quite low.

The use of YIG oscillator 19 is advantageous in that a typical Q is approximately 2,000 and the tuning curve is very linear over an octave bandwidth. Moreover, the output of the YIG oscillator is low in spurious frequencies.

The reference 29 of 5 MHz may be a Cesium or Rubidum crystal oscillator.

From a general operational standpoint at higher microwave frequencies the carrier to phase noise ratio continues to improve until it meets a floor somewhere in the area of 9 gigahertz. This is determined by the high frequency reference source A. Specifically the spectral noise density becomes that of the fifth overtone of a crystal oscillator multiplied by 90 to 9 gigahertz. The noise density within the frequency response of the phase locked loop 11 is the total sum of the two reference sources A and B. Below 5 gigahertz, the reference B is the larger noise contributor. However, this contribution remains constant and is indifferent to output frequency. High frequency reference source A has less noise below 5 gigahertz but as the output is moved to 5 gigahertz and beyond this reference continues to be multiplied with each 100 MHz increase in output frequency. When 9 gigahertz is reached by multiplication, reference A is the noisier of the two references and thus the output noise density is that of reference A. An alternative construction to lower this 9 GHz noise floor is to use a 100 to 200 MHz synthesizer 13. The elimination of the divide by ten unit 17 can decrease the noise contribution by 20 dB assuming the 100 to 200 MHz source is as clean as the 10 to 20 MHz source.

In practice, reference A has an output frequency on its line 35 which is always 100 MHz to 200 MHz below the output frequency and is always varied in multiples or steps of 100 MHz. As discussed above, this type of crystal controlled stepped phase locked loop multiplied frequency source provides a relatively low noise output compared to the prior art where a low frequency synthesizer was merely multiplied up to the total output frequency or where a single microwave source was locked to a synthesizer. In applications where high power levels are required an amplifier may be placed at the output of YIG oscillator 19 in line 22.

The synthesizer of the present invention may also be easily FM modulated by summing an external FM signal into the YIG tuning coil through the YIG itself.

Thus, the present invention has provided a microwave frequency synthesizer which is low noise with high spectral purity.

I claim:

1. A low noise, high spectral purity microwave frequency synthesizer comprising: a tunable microwave oscillator; a phase locked loop (PLL) including said oscillator and a series coupled mixer and phase detector, said phase detector having an output coupled to and driving said tunable oscillator, the output of said oscillator being coupled to said mixer, and the output of said mixer being coupled to said phase detector, said mixer and phase detector being respectively coupled to and responsive to first and second reference sources, said first reference source providing an output frequency of the same order of magnitude as the output of said frequency synthesizer and being of the crystal controlled type and where said output frequency is variable in discrete steps, said second reference source being continuously variable over a frequency range equivalent to the range of said step and at least an order of magnitude below said output frequency of said first reference source.

2. A synthesizer as in claim 1 where said steps are 100 MHz and said range of said second source is 10–20 MHz and where said PLL includes a divide by 10 unit between said mixer and phase detector.

3. A synthesizer as in claim 1 where said tunable microwave oscillator is a YIG (yttrium-iron-garnet) unit.

4. A synthesizer as in claim 1 where the output frequency of said first source is offset from said output of said frequency synthesizer by said discrete step.

* * * * *